May 30, 1967 J. S. WALKER 3,323,023

SEMICONDUCTOR APPARATUS

Filed July 22, 1964

Inventor
JOHN S. WALKER
By Mueller and Aichele
Attys.

United States Patent Office 3,323,023
Patented May 30, 1967

3,323,023
SEMICONDUCTOR APPARATUS

John S. Walker, Phoenix, Ariz., assignor to Motorola, Inc., Franklin Park, Ill., a corporation of Illinois
Filed July 22, 1964, Ser. No. 384,498
8 Claims. (Cl. 317—101)

This invention relates to semiconductor apparatus, and more particularly to an improved interconnected microcircuit assembly.

The art of solid state physics has progressed to a point where an entire circuit, such as a multi-vibrator, oscillator or inverter, may be constructed of a unitary block of semiconductor material. Such blocks are generally quite small, for example, of the order of one quarter inch or less for their maximum dimension, and are referred to as integrated circuits or microcircuits. A plurality of electrical leads may extend from such a block or microcircuit for electrically connecting the microcircuit to other such microcircuits or to further circuit components, for conducting signals to and from the microcircuit.

It is often desirable to interconnect several such microcircuits as a system or as a functioning module in a system. Where such is the case, full utilization of the small size of the microcircuits to reduce the overall size of the module or system dictates that a minimum of space be occupied by inter-connections, and that the microcircuits be placed relative to one another in a manner that occupies as little space as possible. The achievement of such ends is often complicated by problems of efficient soldering or welding of connections and proper ventilation or heat sinking for cool operation.

Accordingly, it is an object of this invention to provide an improved inter-connected microcircuit assembly.

Another object of the invention is to provide an inter-connected microcircuit assembly occupying minimum space and readily susceptible of provision for cool operation.

Still another object of the invention is the provision of an inter-connected microcircuit assembly which is easily constructed and wherein electrical inter-connection may be made efficiently.

A feature of the invention is the provision of a harness for microcircuit elements including a channel with openings on the sides, and further including a laminated conductor structure. Microcircuit elements may be disposed in the channel, and conductors and leads extend through openings in the sides of the channel for soldering or welding.

Another feature of the invention is the provision of two assemblies, as above described, with the channels thereof spaced back to back. A heat sink may be disposed between the two channels for conducting heat therefrom.

Still another feature of the invention is the provision, in an assembly as above described, of a cover therefor, which cover is filled with an encapsulant.

Referring to the drawings.

Figures 1, 2, 3, 4:
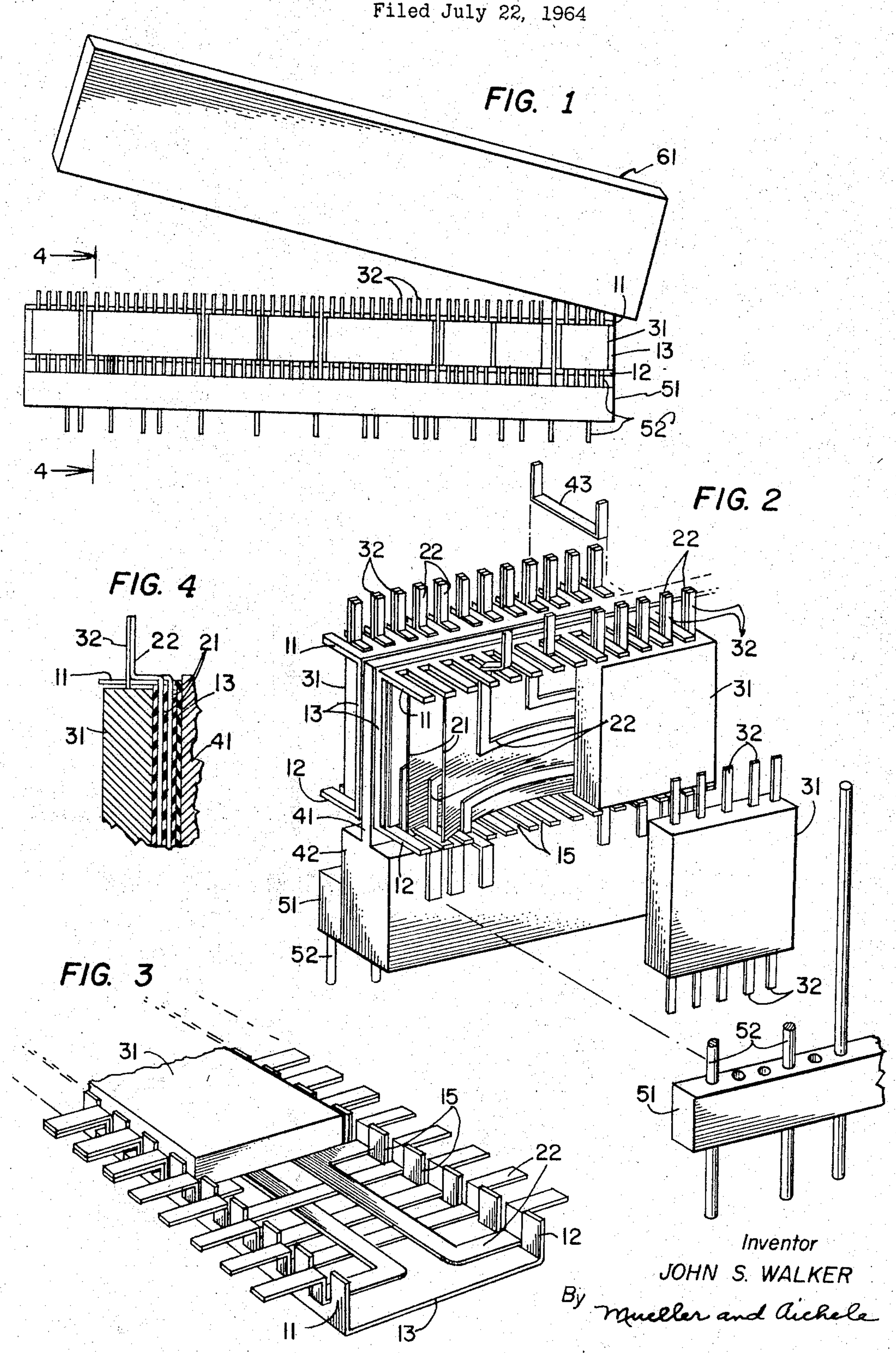
FIG. 1 is an elevational view of an inter-connected microcircuit assembly constructed in accordance with the invention, and with a cover therefor in exploded perspective.
FIG. 2 is a partially exploded assembly view, in perspective, of a portion of an inter-connected microcircuit assembly constructed in accordance with the invention.
FIG. 3 is a perspective view schematically illustrating the assembly of the invention.
FIG. 4 is a sectional view taken along the line 4—4 of FIG. 1.

In accordance with the invention, an inter-connected microcircuit assembly includes an elongated channel having a pair of parallel sides and a central portion joining the sides. Each of the sides has a plurality of openings spaced along the length thereof. A plurality of laminated insulating layers are disposed in the channel adjacent to and parallel with the central portion. The insulating layers have a plurality of conductors sandwiched therebetween, and the conductors extend beyond the edges of the insulating layers at predetermined locations and extend through the openings in the sides of the channel. A plurality of microcircuits are disposed in the chnanel adjacent the insulating layers. These microcircuits have a plurality of electrical leads extending therefrom through the openings in the sides of the channel, which leads are disposed adjacent the conductors exteriorly of the channel to facilitate electrical connection between the conductors and the electrical leads and further circuit components.

One form of the invention contemplates two assemblies as described above, wherein the channels are disposed with the central portions adjacent to and parallel with each other and with the channels opening in opposite directions. Connection is thereby facilitated between microcircuits and conductors in respective ones of said channels. Furthermore, such construction is compact, lending itself to be covered and if such is desired, the cover may be filled with an encapsulant to further protect the microcircuits.

Referring now more particularly to the drawings, an inter-connected microcircuit assembly constructed in accordance with the invention is illustrated. The assembly comprises a pair of elongated channels disposed back to back such that they open in opposite directions. Each channel has a pair of parallel sides 11 and 12 joined by a central portion 13. Each of sides 11 and 12 have a plurality of openings 15 spaced along the length thereof.

A laminated conductor structure is disposed in the channel adjacent to and parallel with central portion 13. This structure includes a plurality of single sided, etched printed circuit boards 21, disposed in layers along the central portion 13. Each of printed circuit boards 21 carries one or more conductors 22 on the surface thereof, such that conductors 22 are sandwiched between circuit boards 21. Conductors 22 may be of any desired configuration and extend beyond the edges of boards 21 at predetermined locations for inter-connection. This may be more clearly understood from the schematic representation in FIG. 3, wherein the circuit boards are not shown.

Circuit boards 21 are preferably made of polyester, polyimide, or fluorocarbon such as are manufactured and sold by Dupont Corp. of Wilmington, Delaware under the trademarks Mylar, H Film and Teflon, respectively. Conductor 22 may be formed on circuit board 21 by etching away a copper surface on a plastic film substrate. Other constructions and methods of construction for the laminated conductor structure may also be used within the scope of this invention.

A plurality of microcircuits comprised of semiconductor blocks 31 are disposed in the channel adjacent the laminated structure formed by circuit boards 21 and conductors 22. Semiconductor blocks 31 have a plurality of leads 32 extending from opposite ends thereof to afford electrical contact with the semiconductor material forming the microcircuit at appropriate places. Leads 32 extend through openings 15 in side 12 of the channel.

Conductors 22 extend beyond the edges of printed circuit boards 21 and are formed with a pair of right angle bends therein to extend through openings 15 adjacent leads 32 outwardly of the channel.

Such a construction not only provides a compact assembly, but affords a simple and efficient way of inter-connecting the conductors, leads and further circuit components. The leads 32 of the microcircuits 31 may be easily welded directly to the adjacent conductors 22. Two channels may be disposed with their center portions 13 adjacent each other such that the channels open in opposite directions (see FIG. 2). If heat sinking is required, this may be readily accomplished by disposing the thin web portion 41 of heat sink 42 between the central portions 13 of the two channels. Inter-connection from microcircuits in one channel to microcircuits in the other channel is easily accomplished by a connector bridge 43 as shown in FIG. 2. Connection to circuit components exterior of the assembly may be made by means of a plug unit 51 having a plurality of conductors 52 thereon. Conductors 52 receive the downwardly projecting welded combinations of conductors 22 and leads 32 and the unit 51 may lie against heat sink 42, occupying little space.

A cover 61 for the assembly may be formed to fit over the assembly to protect the same. For certain environmental conditions, the assembled unit may be further protected by filling the cover with an encapsulant.

Numerous advantages are provided by the foregoing construction. The extra connections from layer to layer in conventional multi-layer printed circuit boards are eliminated with the ability to weld component leads directly to the conductors extending from the laminated structure. Metallic module cases, ground planes between the inter-connected circuit layers, and a ground plane between the channels of the module, are possible and provide better shielding. All microcircuits may be in contact with the module cover which, if metallic, can provide good thermal conduction to the outside. Where convection cooling is impractical, heat may be conducted through an optional internal heat sink. Excessive tooling is not required, making such an assembly useful for fabricating prototypes. The positioning of the leads and conductors adjacent each other permits comparatively simple automatic welding for production purposes.

It may therefore be seen that the invention provides an improved inter-connected microcircuit assembly which occupies a minimum space and is readily susceptible of provision for cool operation. The assembly is easily constructed and electrical inter-connection may be made efficiently.

I claim:

1. An inter-connected microcircuit assembly including in combination, an elongated channel having a pair of parallel sides and a central portion joining said sides, each of said sides having a plurality of openings spaced along the length thereof, a plurality of rectangular insulating layers disposed in said channel adjacent to and parallel with said central portion and forming a laminated structure, conductor means having first portions supported on said layers and insulated thereby and second portions extending beyond one pair of opposite edges of said insulating layers at predetermining locations and extending through said openings in said sides, and a plurality of microcircuit units disposed in said channel adjacent said layers and having electrical leads extending therefrom through said openings in said sides and being disposed adjacent said second portion of said conductor means exteriorly of said channel to facilitate electrical connection between said conductor means and said electrical leads.

2. An inter-connected microcircuit assembly including in combination, a pair of elongated channels each having a pair of parallel sides and a central portion joining said sides, said channels being disposed with said central portions adjacent to and parallel with each other and with said channels opening in opposite directions, each of said sides having a plurality of openings spaced along the length thereof, a laminated structure including a plurality of rectangular insulating layers having conductor means thereon disposed in each of said channels adjacent to and parallel with said central portion thereof, said conductor means having first conductive portions secured to said insulating layers and insulated thereby and second conductive portions extending beyond one pair of opposite sides of said insulating layers and through said openings in said sides, and a plurality of microcircuits disposed in each of said channels adjacent said laminated structure, said microcircuits having a plurality of electrical leads extending therefrom through said openings in said sides and being disposed adjacent said second conductive portions exteriorly of said channels to facilitate electrical connection between said conductors and to said electrical leads and further circuit components.

3. The combination of claim 2 including further conductor means adjacent said sides exteriorly of said channel inter-connecting predetermined ones of said conductor portions and said electrical leads in different ones of said channels.

4. The combination of claim 2, wherein heat conduction means are disposed between said central portions of said channels for cooling said microcircuits.

5. The combination of claim 2, wherein said channels and said conductor means and said microcircuits are enclosed by a cover.

6. The combination of claim 5, wherein said cover is filled with an encapsulant.

7. An inter-connected microcircuit assembly, including in combination, a pair of elongated channels, each having a pair of parallel sides and a central portion joining said sides, said channels being disposed with said central portions thereof adjacent each other and with said channels opening in opposite directions, each of said sides having a plurality of openings spaced along the length thereof, a plurality of laminated insulating layers disposed in each of said channels adjacent to and parallel with said central portion thereof, said insulating layers having a plurality of conductors sandwiched therebetween, said conductors having first portions secured to said insulating layers and insulated thereby and second portions extending beyond the edges of said insulating layers at predetermined locations and extending through said openings in said sides, and a plurality of microcircuits disposed in said channels adjacent said insulating layers, said microcircuits having a plurality of electrical leads extending therefrom through said openings in said sides and being disposed adjacent said conductors exteriorly of said channels to facilitate electrical connection between said conductors and to said electrical leads and further circuit components.

8. An inter-connected microcircuit assembly including in combination, a plurality of rectangular insulating layers disposed adjacent to each other and forming a laminated structure, conductor means having first portions supported on said insulating layers and insulated thereby, and second portions extending beyond opposite edges of said insulating layers at predetermined locations, a plurality of microcircuits each having a flat housing disposed adjacent one of said insulating layers, each of said microcircuits having a plurality of electrical leads extending from opposite sides of the housing thereof, said leads being disposed adjacent predetermined ones of said second portions of said conductor means, said second portions of said conductor means being connected together and to said leads whereby said microcircuits are inter-connected into a predetermined circuit, and encapsulating material about said microcircuits and said layers, said conductor means having terminal portions extending from the assembly for making external connections to the predetermined circuit.

(References on following page)

References Cited

UNITED STATES PATENTS

| | | | |
|---|---|---|---|
| 3,177,405 | 4/1965 | Gray | 317—101 |
| 3,185,761 | 5/1965 | McHugh | 317—101 |

OTHER REFERENCES

Electronic Design, Apr. 12, 1963, Five Factors in Designing Welded Modules, by Corbett and Follett, Table 2, Matrix Types, page 46.

Electronic Design, Apr. 27, 1964, page 86.

ROBERT K. SCHAEFER, *Primary Examiner.*

ROBERT S. MACON, *Examiner.*

J. J. BOSCO, *Assistant Examiner.*